United States Patent [19]

Kimizuka et al.

[11] Patent Number: 4,695,714
[45] Date of Patent: Sep. 22, 1987

[54] LIGHT SOURCE STABILIZER WITH INTENSITY AND TEMPERATURE CONTROL

[75] Inventors: Junichi Kimizuka, Yokohama; Yukihide Ushio, Tokyo; Kaoru Seto, Chigasaki, all of Japan

[73] Assignee: Canon Kabushiki Kaisha, Tokyo, Japan

[21] Appl. No.: 576,402

[22] Filed: Feb. 2, 1984

[30] Foreign Application Priority Data

Feb. 8, 1983 [JP] Japan ............................ 58-18065

[51] Int. Cl.$^4$ .............................................. G01U 1/32
[52] U.S. Cl. ...................................... 250/205; 250/238
[58] Field of Search .................. 250/205, 238, 214 C; 372/34–36; 455/618

[56] References Cited

U.S. PATENT DOCUMENTS

| | | | |
|---|---|---|---|
| 3,973,852 | 8/1976 | Moore et al. | 372/34 |
| 4,019,159 | 4/1977 | Hon et al. | 372/34 |
| 4,125,777 | 11/1978 | O'Brien et al. | 250/205 |
| 4,201,994 | 5/1980 | Hoshito et al. | 346/108 |
| 4,284,884 | 8/1981 | Dyment et al. | 250/205 |
| 4,338,577 | 7/1982 | Sato et al. | 372/36 |
| 4,375,067 | 2/1983 | Kitamura | 250/205 |
| 4,387,462 | 6/1983 | Markus | 372/34 |
| 4,417,179 | 11/1983 | Fujimura et al. | 250/205 |
| 4,443,695 | 4/1984 | Kitamura | 250/205 |

Primary Examiner—David C. Neims
Attorney, Agent, or Firm—Fitzpatrick, Cella, Harper & Scinto

[57] ABSTRACT

A light source stabilizer comprises a light emitting device, a heating element for heating the light emitting device, a temperature sensor for sensing a temperature of the light emitting device, a temperature control circuit for controlling the heating element by the output of the temperature sensor, a light intensity detector for detecting a light intensity of the light emitting device and a light intensity control circuit for controlling the light emitting device by the output of the light intensity detector.

13 Claims, 5 Drawing Figures

LIGHT SOURCE STABILIZER WITH INTENSITY AND TEMPERATURE CONTROL

BACKGROUND OF THE INVENTION

1. Field of the Invention

The present invention relates to a light source stabilizer for stabilizing the output of a light source, such as a laser beam.

2. Description of the Prior Art

In a prior art light source stabilizer, light intensity is controlled to stabilize the light intensity of a laser in a recording operation. For example, U.S. patent application Ser. No. 225,345, now U.S. Pat. No. 4,443,695 discloses a method for detecting a back beam of a laser and controlling the light intensity of the laser in accordance with the detected back beam.

However, in the method of detecting the back beam of the laser and feeding it back, the light intensity is stabilized but a wavelength of the beam cannot be stabilized. Accordingly, if the sensitivity of a photosensitive material to which the laser beam is applied changes with the wavelength, the density of an image formed changes even if the light intensity is stabilized and an image of constant density cannot be reproduced.

Further, when an ambient temperature changes, the sensitivity of a photodetector changes and the light intensity of the laser changes.

SUMMARY OF THE INVENTION

It is an object of the present invention to provide a light source stabilizer to produce a stable light beam output.

It is another object of the present invention to provide a light source stabilizer which stabilizes both the light beam intensity and the light beam wavelength.

It is yet another object of the present invention to provide a light source stabilizer which carries out temperature control by simultaneously heating a light emitting device and a photosensing device to prevent a temperature drift of the photosensing device.

It is a further object of the present invention to provide an image recording apparatus which can record an excellent image by using a stable beam.

It is yet a further object of the present invention to provide a light source stabilizer which is simple in construction and inexpensive.

It is still another object of the present invention to provide a highly safe light source stabilizer.

Other objects of the present invention will be apparent from the following detailed description of the invention.

DETAILED DESCRIPTION OF THE PREFERRED EMBODIMENTS

Figure 1:
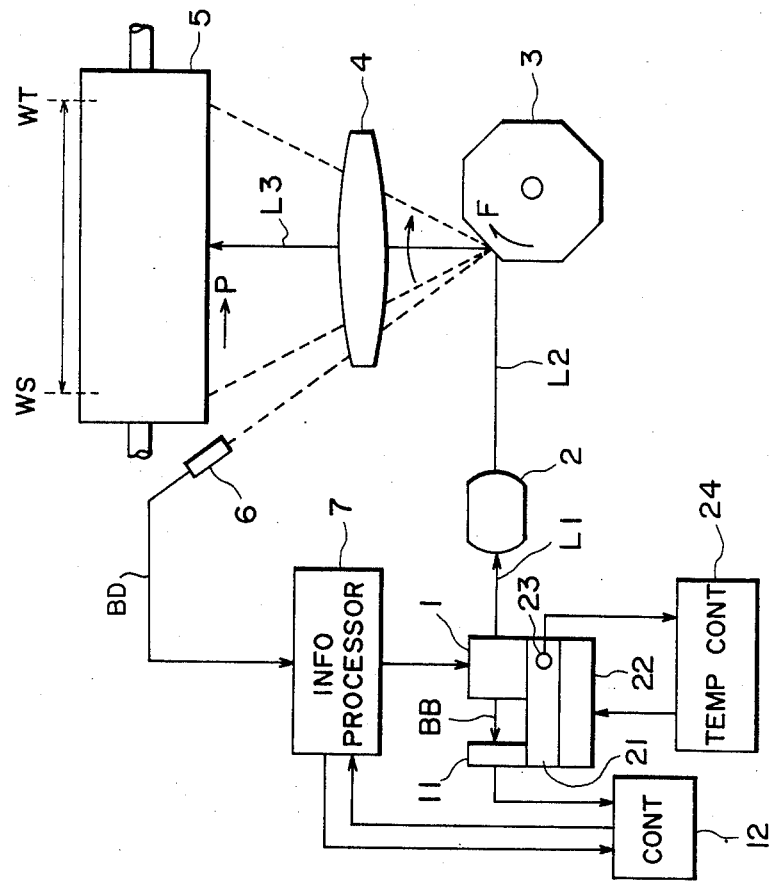
FIG. 1 shows a configuration of a beam recording apparatus in accordance with the present invention, FIGS. 2 and 3 shown embodiments of a light intensity control circuit.

FIG. 1 shows an embodiment of a beam recording apparatus which incorporates a light source stabilizer of the present invention. A laser beam L1 emanated from a semiconductor laser 1 is collimated by a collimater lens 2 into a collimated light beam L2 which impinges on a rotary polygon mirror deflector 3 rotated at a constant speed in a direction of an arrow F.

A laser beam L3 deflected by the rotary polygon mirror 3 is focused by a focusing lens 4 onto a photosensitive drum 5 of an electrostatic recording apparatus. The focused spot is moved in a direction of an arrow P as the rotary polygon mirror 3 rotates.

By rotating the rotary polygon mirror 3 at a high speed and rotating the photosensitive drum 5 at a constant speed in a predetermined direction, all areas of the photosensitive drum 5 can be scanned by the laser beam L3.

Numeral 6 denotes a beam detector arranged externally of the recording area of the photosensitive drum 5. When the beam detector 6 detects the laser beam L3, it generates a synchronizing signal BD, which is applied to an information processing circuit 7, which in turn applies a record signal to the semiconductor laser 1 at a timing controlled by the synchronizing signal.

Accordingly, the laser 1 emits the laser beam L1 which is modulated by the record signal. This control is disclosed in Japanese Patent Application Laid-Open No. 89346/1976 and hence the explanation thereof is omitted.

Thus, the laser beam L3 modulated by the record signal impinges on to the photosensitive drum 5. Since the photosensitive drum 5 is uniformly pre-charged by a charger, not shown, an electrostatic latent image is formed as the laser beam L3 impinges on it, and the electrostatic latent image is made visible by a developer, not shown, and the developed image is transferred to a paper by a transfer unit, not shown, and the transferred image on the paper is fixed by a fixer, not shown, to form an image representing the record signal on the paper. The above sequence has been well known and the explanation thereof is omitted.

The semiconductor laser 1 emits the laser beam (front beam) L1 forwardly as well as a back beam BB backwardly. This back beam BB is detected by a photodetector 11 to produce a detection signal representing beam intensity. The photodetector is preferably a photodiode. The detection signal is applied to a control circuit 12 to control a beam emitting intensity of the semiconductor laser 1.

Figure 2:
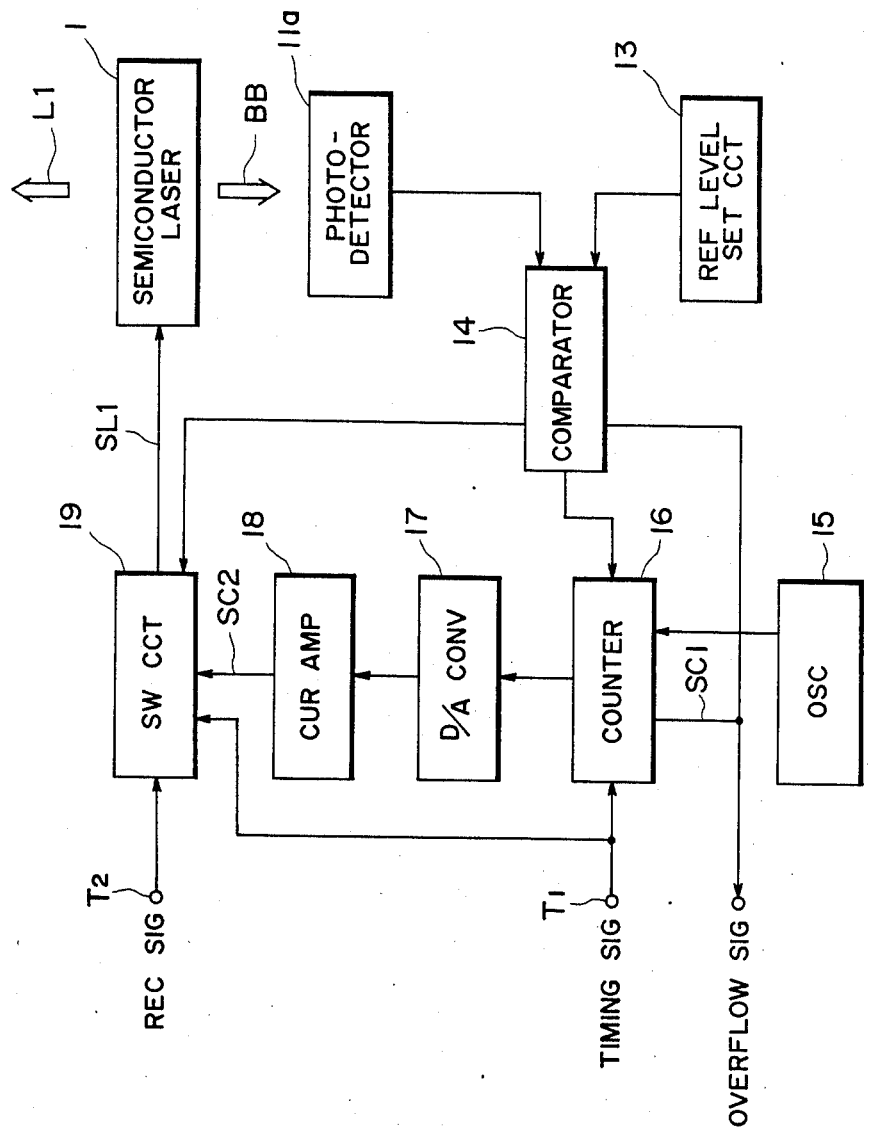

FIG. 2 shows a detail of a light intensity (at light power) control circuit contained in the control circuit 12 and the information processing circuit 7. Numeral 13 denotes a reference level setting circuit for generating a reference signal of a predetermined potential, numeral 14 denotes a comparator circuit which compares a detection signal from a photo-detection circuit 11a including the photodetector 11 with the reference signal from the reference level setting circuit 13 and stops a count operation of a counter 16 when the former signal is larger than the latter, numeral 15 denotes an oscillator for producing a signal of a constant frequency, and numeral 16 denotes the counter connected to the oscillator 15 to count up the oscillation signal. It starts the count operation when a timing signal is applied from an input terminal T1 to the counter 16, and if the count operation is not stopped by the output of the comparator 14 before the count reaches a predetermined value, it produces an overflow signal on a signal line SC1, clears the counter, stops the count operation and stops the operation of the comparator 14.

Numeral 17 denotes a D/A converter for converting the count in the counter 16 to an analog signal, numeral 18 denotes a current amplifier connected to the D/A converter 17 for amplifying the analog signal, and numeral 19 denotes a switching circuit which is turned on and off by the record signal applied to an input terminal T2. In the present embodiment, when a digital "1" signal is applied to the terminal T2 to turn on the switching circuit 19, a current is supplied to the semiconductor laser 1 through a signal line SL1, and when a digital "0" signal is applied to the terminal T2 to turn off the switching circuit 19, no current is supplied to the semiconductor laser 1.

The operation of the beam recording apparatus will now be explained. When the timing signal is applied to the input terminal T1 (for example, the timing signal is generated in an idling time between the end of recording of one page of image by the beam recording apparatus and the beginning of recording of the next one page of image, the switching circuit 19 is turned on and the counter 16 is cleared, and then the count operation is started.

As the counter 16 counts up, the count Na is incremented and the current on the signal line SL1 increases accordingly. As a result, the intensity of the beam emitted from the semiconductor laser 1 gradually increases. The count operation continues until the detection signal exceeds the reference signal.

Assuming that the detection signal exceeds the reference signal when the count of the counter 16 reaches Na, the count operation is stopped by the output of the comparator 14, and the counter 16 holds the count Na until the next timing signal is applied, and the on-state of the switching circuit 19 is cleared.

As a result, a current Ia corresponding to the count Na is produced on the signal line SL1, and when the record signal is applied to the input terminal T2, the semiconductor laser 1 is driven by the current Ia.

If the comparator 14 does not produce the counter stop signal when the count of the counter 16 reaches Na, by a failure in the photodetection circuit 11a, the counter 16 produces the overflow signal on the signal line SC1 to stop the operation of the comparator 14 and clear the counter 16 to the initial count N1. Accordingly, if the current on the signal line SL1 increases so much that the semiconductor laser 1 is driven to the point of almost being damaged the drive current is decreased to prevent damage to the semiconductor laser 1.

Figure 3:
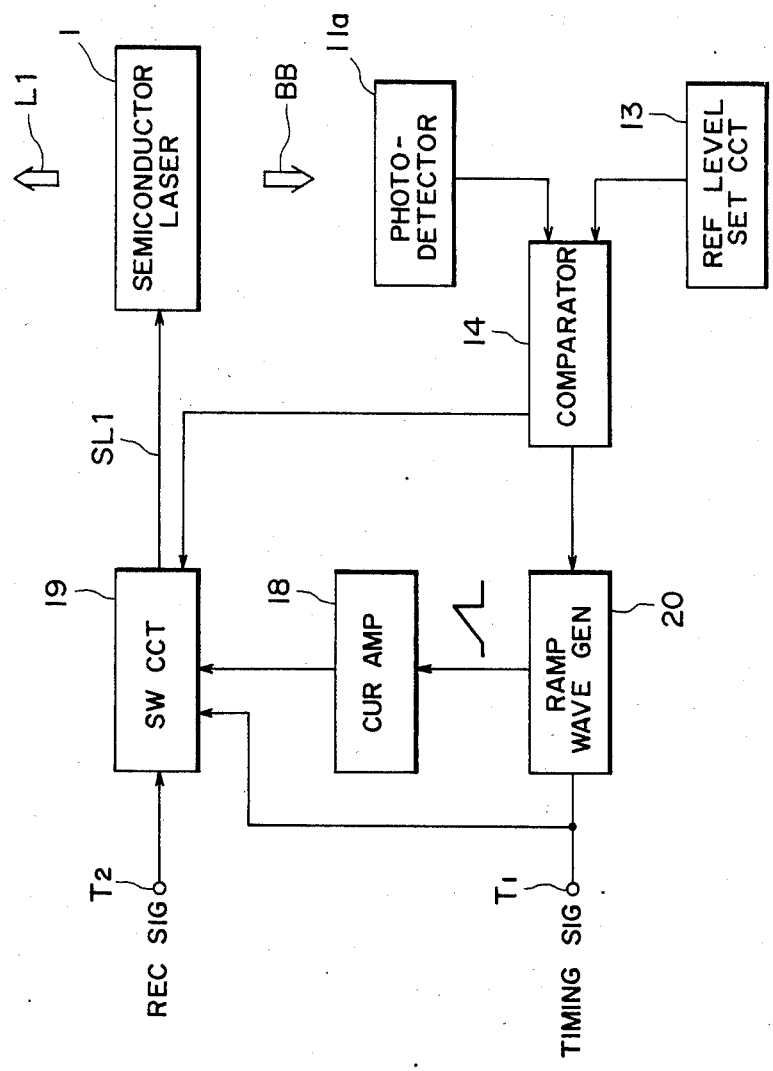

FIG. 3 shows another embodiment, in which the oscillator 15, the counter 16 and the D/A converter 17 of FIG. 2 are replaced by a ramp voltage generator 20 which generates a voltage increasing with time. The generation of the ramp voltage is started by the application of the timing signal to the input terminal T1 and the output level is held when the output of the compare circuit 14 is produced. The operations of other circuits are identical to the embodiment of FIG. 2 and the like circuits to those of FIG. 2 are designated by the like numerals.

In the embodiments shown in FIGS. 2 and 3, the timing signal is generated after the end of recording of one page of image on the photosensitive drum 5 by the laser beam L1 and before the start of recording of the next page, and the recording of the next page is started after the light intensity control. Alternatively, the timing signal may be generated after the laser beam L1 has arrived at the beam detector 6 and before the laser beam arrives at a left end WS of a transfer region (WS-WT) on the photosensitive drum 5, and the light intensity control may be completed before the beam arrives at the left end WS.

In the above embodiments, the back beam BB of the semiconductor laser 1 is utilized as the input light to the photodetection circuit 12. Alternatively, a portion of the front beam may be used or the front beam L1 may be introduced to the photodetection circuit by using the optical system only during the light intensity control.

The temperature compensation circuit 24 shown in FIG. 1 is now explained. As shown in FIG. 1, the semiconductor laser 1 and the photodetection 11 are mounted on a base 21 of a high thermal conductivity. The base 21 may be a metal plate of aluminum or copper. A heating element 22 is attached in contact to the base 21, and a temperature sensor 23 is attached in contact to the base 21. The temperature sensor 23 may be a thermistor or a thermocouple. In order to exactly detect the temperature of the semiconductor laser, it is preferable to attach the temperature sensor closely to the semiconductor laser. The heating element may be a nichrome heater insulated by silicone rubber or mica.

Figure 4:
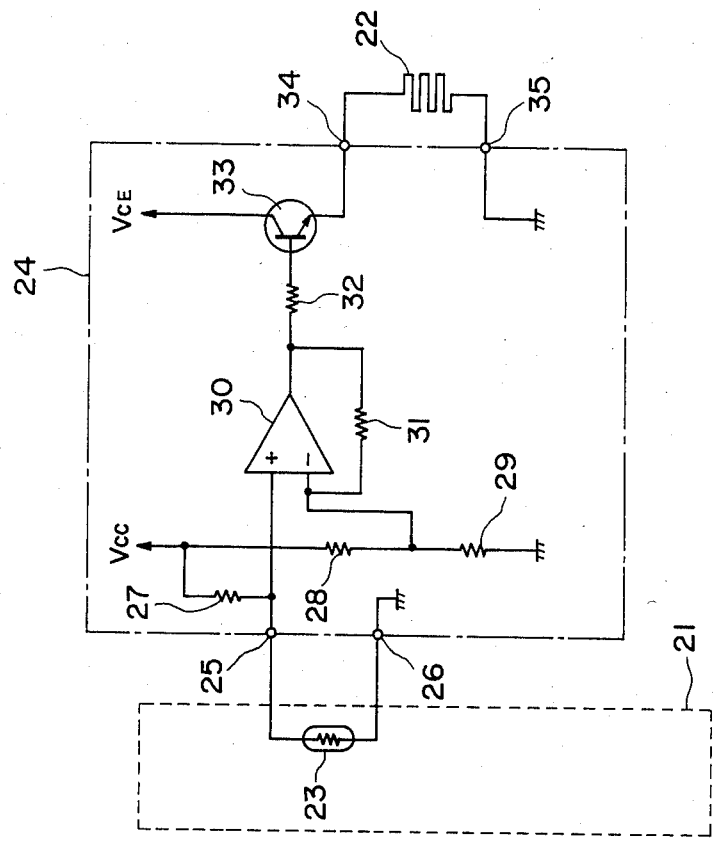
FIG. 4 shows an embodiment of a temperature control circuit.

The temperature control circuit 24 functions to change a current to the heating element 22 in accordance with the output of the temperature sensor 23. An embodiment of the circuit 24 is shown in FIG. 4, in which numerals 25 and 26 denote input terminals for connecting the temperature sensor 23 to the circuit 24, numeral 27 denotes a resistor for supplying a voltage Vcc to the temperature sensor 23, numerals 28 and 29 denote a voltage dividing resistor for setting a reference voltage, numeral 30 denotes an operational amplifier, numeral 31 denotes a feedback resistor of the operational amplifier 30, numeral 32 denotes a phase current limiting resistor, numeral 33 denotes a current amplifying transistor connected to the power supply Vcc, which receives an output of the operational amplifier 30 through the resistor 32, and numerals 34 and 35 denote output terminals for connecting the heating element 22 to the transistor 33 and ground, respectively.

When the temperature of the base 21 is low, the resistance of the temperature sensor 23 is high and the potential at the input terminal 25 is high. If this voltage is higher than the reference voltage determined by the voltage dividing resistors 28 and 29, the opoerational amplifier 30 functions to increase the collector current of the transistor 33. As a result, the current to the heater 22 increases and the temperature of the base 21 rises. On the other hand, when the temperature of the base 21 is high, the collector current is low. In this manner, the temperature of the base 21 is kept constant. Accordingly, in the light intensity control, the variation of the sensitivity due to the change of the temperature of the photodetector is prevented and the light intensity is stabilized. The variation of the wavelength of the light emitted by the light emitting device is also prevented. Accordingly, a stable image density is assured irrespective of the variation of the wavelength-sensitivity characteristic of the photodetector. The constant temperature of the base 21 is referred to as a control temperature. The control temperature is determined by the voltage dividing resistors 28 and 29. Since the semiconductor laser is weak to the heat, the control temperature is set to be approximately equal to the highest ambient temperature (e.g. 45° C.). The highest ambient temperature is defined as a highest ambient temperature of the device which contains the semiconductor laser.

It may be possible to heat and cool the laser by a single device by using a Peltier effect device. However, the Peltier effect device is expensive and the direction of current to the Peltier effect device must be switched to attain heating and cooling and the control therefor is complex. In present invention, only the heating is needed and an inexpensive heater can be used and a simple drive circuit can be used. Accordingly, an inexpensive stabilizer is provided.

As described hereinabove, by simultaneously controlling the temperatures of the light emitting device and the photodetector mounted on the same base to the highest ambient temperature and controlling to light intensity, the light intensity and the wavelength of the light emitting device are stabilized with inexpensive construction.

Figure 5:
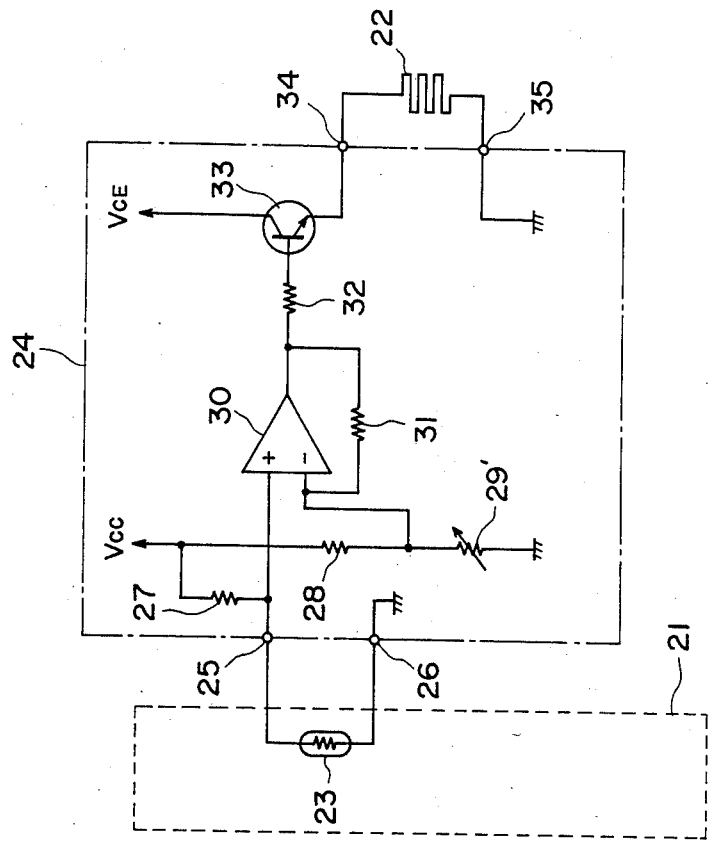
FIG. 5 shows another embodiment of the temperature control circuit.

In another embodiment of the present invention shown in FIG. 5, the resistor 29 of FIG. 4 is replaced by a potentiometer 29' so that a service man adjusts the resistance to adjust the control temperature depending on a region in which the apparatus is used. When the apparatus is used in a cold climate region, the control temperature may be set lower so that the semiconductor laser and the photodetector reach the control temperature faster. Thus, the apparatus can be brought to a ready status in a short time.

When the control temperature is adjusted, the light intensity may also be adjusted. It may be done by linking the reference level setting circuit 13 of FIG. 2 to the potentiometer 29 so that the reference signal is adjusted as the resistance of the potentiometer is adjusted.

Since the sensitivity of the photosensitive drum usually changes with temperature, a stable image is produced by adjusting the light intensity together with the control temperature, depending on the region.

In the above embodiments, it is preferable to effect the light intensity control after the semiconductor laser and the photodetector have reached the control temperature because, in the apparatus in which the light intensity is adjusted in the idling time between the end of recording of one page of image and the start of recording of next page, if the light intensity is adjusted before the semiconductor laser and the photodetector reach the control temperature, the temperature of the semiconductor laser may change during the recording of one page of image and the light intensity may also change, which results in the change in the image density.

The present invention is not limited to the illustrated embodiments but many variations thereof may be made within a scope of the appended claims.

What we claim is:
1. A light source stabilizer comprising:
light emitting means;
heating means for heating said light emitting means;
temperature sensing means for sensing a temperature of said light emitting means;
temperature control means for controlling said heating means in accordance with the output of said temperature sensing means, wherein said temperature control means sets the control temperature to be approximately equal to the highest ambient temperature of said light emitting means;
light intensity detection means for detecting light intensity of said light emitting means; and
light intensity control means for controlling the light intensity of said light emitting means in accordance with the output of said light intensity detection means, wherein said light intensity control means effects control of the light intensity of said light emitting means after the temperature sensed by said temperature sensing means reaches the control temperature.

2. A light source stabilizer according to claim 1 further comprising a base having a high thermal conductivity;
said light emitting means, said light intensity detection means and said temperature sensing means being mounted on said base.

3. A light source stabilizer according to claim 2 wherein said base is a metal plate.

4. A light source stabilizer according to claim 1 wherein said light intensity control means includes reference signal generating means for generating a reference signal, wherein the output of the light intensity control means is generated as a function of a comparison of a signal corresponding to light intensity of said light emitting means with the reference signal.

5. A light source stabilizer according to claim 1 wherein said temperature control means includes means for adjusting the control temperature.

6. A light source stabilizer according to claim 1, further comprising image forming means for forming an image on a page of a recording medium utilizing the light beam outputted from said light emitting means, wherein said light intensity control means controls the light intensity of said light emitting means every time that said image forming means forms an image on another page.

7. A light source stabilizer according to claim 1, wherein said light emitting means comprises a laser which emits a laser beam modulated in response to a recording signal.

8. A light source stabilizer according to claim 4, wherein said light intensity control means comprises means for comparing the signal corresponding to the light intensity with said reference signal, means for generating a signal for effecting control of the light intensity of said light emitting means, means for increasing driving power applied to said light emitting means in response to generation of the signal, means for stopping the means for increasing the driving power at a given level in response to an output from said comparing means, and holding means for holding the driving power at a given level.

9. A light source stabilizer according to claim 1, wherein said temperature control means exclusively performs heating control by utilizing said heating means.

10. A light source stabilizer comprising:
a light emitting means;
heating means for heating said light emitting means;
temperature sensing means for sensing a temperature of said light emitting means;
temperature control means for controlling said heating means in accordance with the output of said temperature sensing means to keep said light emitting means at a predetermined set temperature;
light intensity detection means for detecting a light intensity of said light emitting means; and
light intensity control means for controlling the light intensity of said light emitting means in accordance with the output of said light intensity detection means;
said light intensity control means effecting control of the light intensity by said light intensity control means after the temperature sensed by said temperature sensing means reaches the predetermined set temperature.

11. A light source stabilizer according to claim 10, wherein said light emitting means comprises a laser which emits a laser beam modulated in response to a recording signal and wherein said light source stabilizer further comprises image forming means for forming an image on a page of a record medium utilizing the laser beam, and controls the intensity of the laser beam every time that said image forming means forms an image on another page.

12. A light source stabilizer according to claim 10, wherein said predetermined set temperature is substantially equal to the highest ambient temperature of said light emitting means.

13. A light source stabilizer according to claim 10, wherein said temperature control means exclusively performs heating control by utilizing said heating means.

* * * * *

UNITED STATES PATENT AND TRADEMARK OFFICE
CERTIFICATE OF CORRECTION

PATENT NO. : 4,695,714

DATED : September 22, 1987

INVENTOR(S) : Junichi Kimizuka, et al.

It is certified that error appears in the above-identified patent and that said Letters Patent is hereby corrected as shown below:

COLUMN 1

Line 26, "an" should read --the--.
    Line 57, "shown" should read --show--.

COLUMN 2

Line 1, "collimater" should read --collimator--.
    Line 28, "to" should be deleted.

COLUMN 3

Line 47, "damaged" should read --damaged,--.

COLUMN 4

Line 12, "photodetection" should read --photodetector--.
    Line 13, "of a high" should read --of high--.
    Line 45, "opoerational" should read --operational--.

UNITED STATES PATENT AND TRADEMARK OFFICE
CERTIFICATE OF CORRECTION

PATENT NO. : 4,695,714

DATED : September 22, 1987

INVENTOR(S) : Junichi Kimizuka, et al.

It is certified that error appears in the above-identified patent and that said Letters Patent is hereby corrected as shown below:

COLUMN 5

Line 5, "In present" should read --In the present--.
    Line 6, "only the heating" should read
        --only heating--.
    Line 30, "29" should read --29'--.

COLUMN 6

Line 53, "a" should be deleted.

Signed and Sealed this

Sixteenth Day of February, 1988

Attest:

DONALD J. QUIGG

Attesting Officer      Commissioner of Patents and Trademarks